United States Patent
Facchin et al.

(10) Patent No.: US 11,668,735 B2
(45) Date of Patent: Jun. 6, 2023

(54) GRANULAR SENSING ON AN INTEGRATED CIRCUIT

(71) Applicant: QUALCOMM Incorporated, San Diego, CA (US)

(72) Inventors: Stefano Facchin, Cork (IE); Baptiste Grave, Douglas (IE); Bharani Chava, Cork (IE); David Jonathan Walshe, Cork (IE)

(73) Assignee: QUALCOMM INCORPORATED, San Diego, CA (US)

( * ) Notice: Subject to any disclaimer, the term of this patent is extended or adjusted under 35 U.S.C. 154(b) by 562 days.

(21) Appl. No.: 16/935,092

(22) Filed: Jul. 21, 2020

(65) Prior Publication Data
US 2022/0026474 A1   Jan. 27, 2022

(51) Int. Cl.
*G02F 1/1368* (2006.01)
*G02F 1/1362* (2006.01)
(Continued)

(52) U.S. Cl.
CPC . *G01R 19/16519* (2013.01); *G02F 1/136286* (2013.01); *H01L 23/5286* (2013.01);
(Continued)

(58) Field of Classification Search
CPC ............. G02F 1/1343; G02F 1/134309; G02F 1/1362; G02F 1/136286; G02F 1/1368;
(Continued)

(56) References Cited

U.S. PATENT DOCUMENTS

2009/0132988 A1   5/2009   Chuang
2011/0316620 A1   12/2011  Kanno et al.
(Continued)

FOREIGN PATENT DOCUMENTS

WO   2018004652 A1   1/2018

OTHER PUBLICATIONS

International Search Report and Written Opinion—PCT/US2021/036446—ISA/EPO—dated Nov. 10, 2021.

*Primary Examiner* — Thoi V Duong
(74) *Attorney, Agent, or Firm* — Procopio, Cory, Hargreaves & Savitch LLP (57) ABSTRACT

An IC is provided. The IC includes a power grid including $M_x$ layer interconnects extending in a first direction on an $M_x$ layer and $M_{x+1}$ layer interconnects extending in a second direction orthogonal to the first direction on an $M_{x+1}$ layer, where x>5. In addition, the IC includes a plurality of power switches. Further, the IC includes at least one sensing element located between the $M_x$ layer and the $M_{x+1}$ layer and configured to measure a voltage drop to devices powered by the plurality of power switches. The one or more of the plurality of power switches may be located below the power grid. The power switches of the plurality of power switches may be adjacent in the first direction and in the second direction to each sensing element of the at least one sensing element.

24 Claims, 8 Drawing Sheets

(51) Int. Cl.
  *G01R 19/165*    (2006.01)
  *H01L 23/528*    (2006.01)
  *H01L 27/092*    (2006.01)
  *H01L 29/24*     (2006.01)
  *H01L 29/786*    (2006.01)

(52) U.S. Cl.
  CPC ............ *H01L 27/092* (2013.01); *H01L 29/24* (2013.01); *H01L 29/7869* (2013.01); *G02F 1/1368* (2013.01)

(58) Field of Classification Search
  CPC .......... G01R 19/16519; G01R 19/0084; G01R 31/2856; H01L 23/5286; H01L 27/0207; H01L 27/092; H01L 29/24; H01L 29/7869
  See application file for complete search history.

(56) References Cited

U.S. PATENT DOCUMENTS

| | | |
|---|---|---|
| 2015/0162448 A1 | 6/2015 | Raghavan et al. |
| 2017/0059650 A1 | 3/2017 | Tipple et al. |
| 2017/0352649 A1 | 12/2017 | Pant et al. |
| 2018/0175184 A1 | 6/2018 | Then et al. |

GRANULAR SENSING ON AN INTEGRATED CIRCUIT

BACKGROUND

Field

The present disclosure relates generally to granular current sensing, and more particularly, to an integrated circuit with a sensing network for providing granular current sensing.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

A sensing network senses power consumption within the network. Existing sensing network designs may not provide enough granularity for indicating precisely where the power is consumed. According, there is a need for improvements in the design of sensing networks.

SUMMARY

In an aspect of the disclosure, an IC includes a power grid including metal x ($M_x$) layer interconnects extending in a first direction on an $M_x$ layer and metal x+1 ($M_{x+1}$) layer interconnects extending in a second direction orthogonal to the first direction on an $M_{x+1}$ layer, where x>5. In addition, the IC includes a plurality of power switches. Further, the IC includes at least one sensing element located between the $M_x$ layer and the $M_{x+1}$ layer and configured to measure a voltage drop to devices powered by the plurality of power switches.

In an aspect of the disclosure, a sensing element on an IC includes a first transistor including a first transistor source, a first transistor drain, and a first transistor gate. The first transistor gate is formed by a first $M_x$ layer interconnect extending in a first direction, where x>5. The sensing element on the IC further includes a second transistor including a second transistor source, a second transistor drain, and a second transistor gate. The second transistor gate is formed by a second $M_x$ layer interconnect extending in the first direction. The first transistor source is coupled to the second transistor source at a common node on the $M_x$ layer and an $M_{x+1}$ layer.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
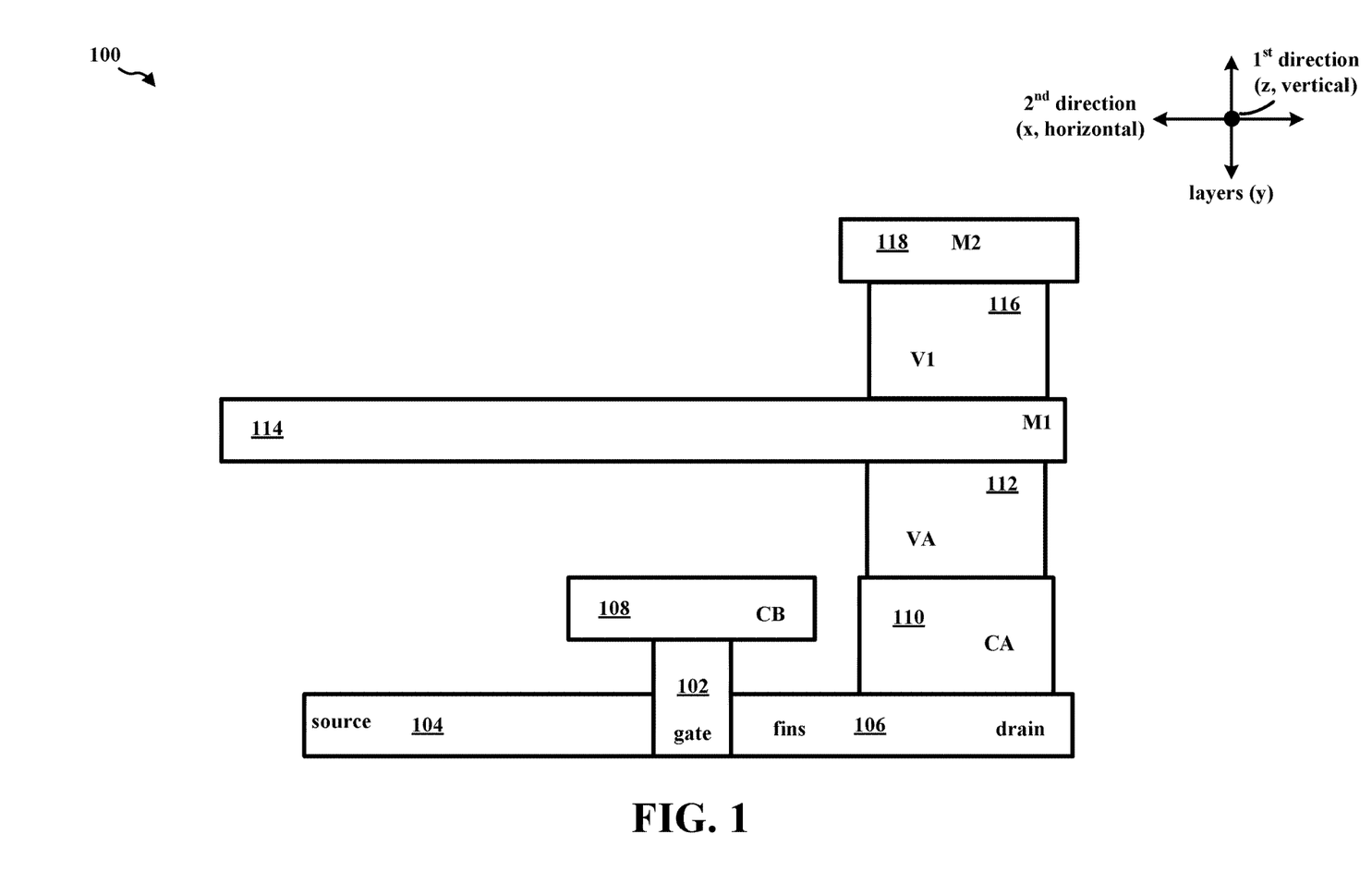
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY even though the gate may be formed of metal, polysilicon, or a combination of polysilicon and metal), a source 104, and a drain 106. The source 104 and the drain 106 may be formed by fins. The gate 102 may extend in a first direction (e.g., vertical direction along the z axis coming out of the page), and the fins may extend in a second direction orthogonal to the first direction (e.g., horizontal direction along the x axis). A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 and/or the drain 106. A via 112 (which may be referred to as via A (VA)) may contact the CA layer interconnect 110. A metal 1 (M1) layer interconnect 114 may contact the via VA 112. The M1 layer interconnect 114 may extend in the second direction only (i.e., unidirectional in the second direction). A via V1 116 may contact the M1 layer interconnect 114. A metal 2 (M2) layer interconnect 118 may contact the via V1 116. The M2 layer interconnect 118 may extend in the first direction only (i.e., unidirectional in the first direction). The M2 layer is a lowest vertical layer. Specifically, the M2 layer may be unidirectional in the vertical direction, and is the closest vertically unidirectional layer to the silicon substrate. Higher layers include a via layer including vias V2 and a metal 3 (M3) layer including M3 layer interconnects. The M3 layer interconnects may extend in the second direction.

Figure 2:
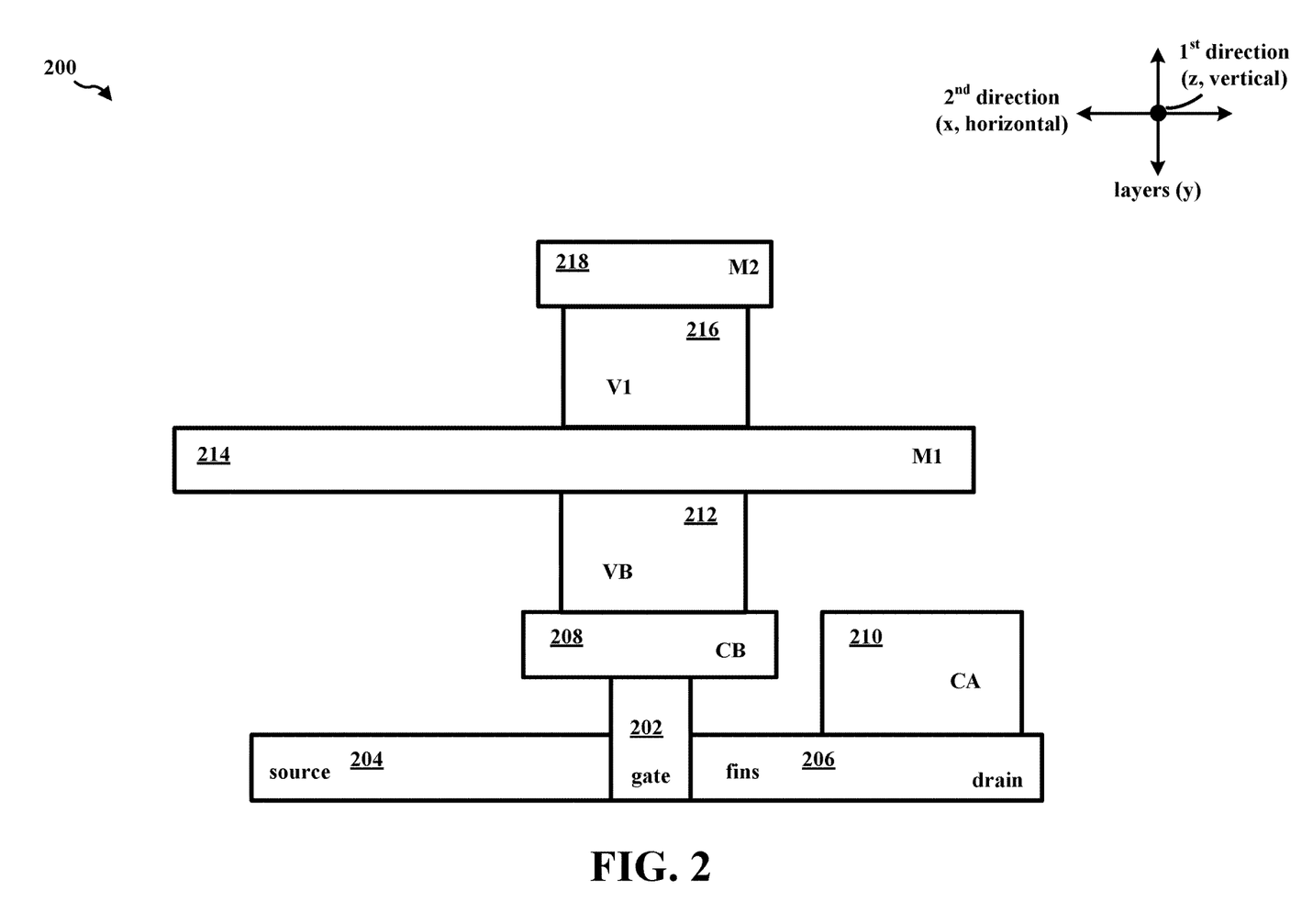
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a first direction (e.g., vertical direction along the z axis coming out of the page), and the fins may extend in a second direction orthogonal to the first direction (e.g., horizontal direction along the x axis). A CB layer interconnect 208 may contact the gate 202. A CA layer interconnect 210 may contact the source 204 and/or the drain 206. A via 212 (which may be referred to as via B (VB)) may contact the CB layer interconnect 208. An M1 layer interconnect 214 may contact the via VB 212. The M1 layer interconnect 214 may extend in the second direction only (i.e., unidirectional in the second direction). A via V1 216 may contact the M1 layer interconnect 214. An M2 layer interconnect 218 may contact the via V1 216. The M2 layer interconnect 218 may extend in the first direction only (i.e., unidirectional in the first direction). The M2 layer is a lowest vertical layer. Specifically, the M2 layer may be unidirectional in the vertical direction and is the closest vertically unidirectional layer to the silicon substrate. Higher layers include a via layer including vias V2 and an M3 layer including M3 layer interconnects. The M3 layer interconnects may extend in the second direction. As discussed supra, a sensing network senses power consumption within the network. Existing sensing network designs may not provide enough granularity for indicating precisely where the power is consumed. A sensing network design that provides improved sensing granularity is provided infra. The provided sensing network preserves local sensing information. The local sensing information provides information on the voltage drop (also referred to as IR drop) and current consumption for specific vectors (activity sequences in a system, such as in a central processing unit (CPU)) that are highly nonuniform. Generally, why some areas on an IC have greater peak current (resulting in higher voltage drop) than other areas may not always be clear. Modeling or simulating peak current and voltage drop gradients across an IC may be too complex, and therefore such information may not be reliable before fabrication of the IC. Accordingly, the provided sensing network with improved granularity and preservation of local sensing information may provide designers with insight as to causes of peak current and voltage drop gradients across an IC. Further, the provided sensing network with improved granularity and preservation of local sensing information may provide fast local sensing across the IC. Such information may be useful for debugging and redesigns.

Figure 3:
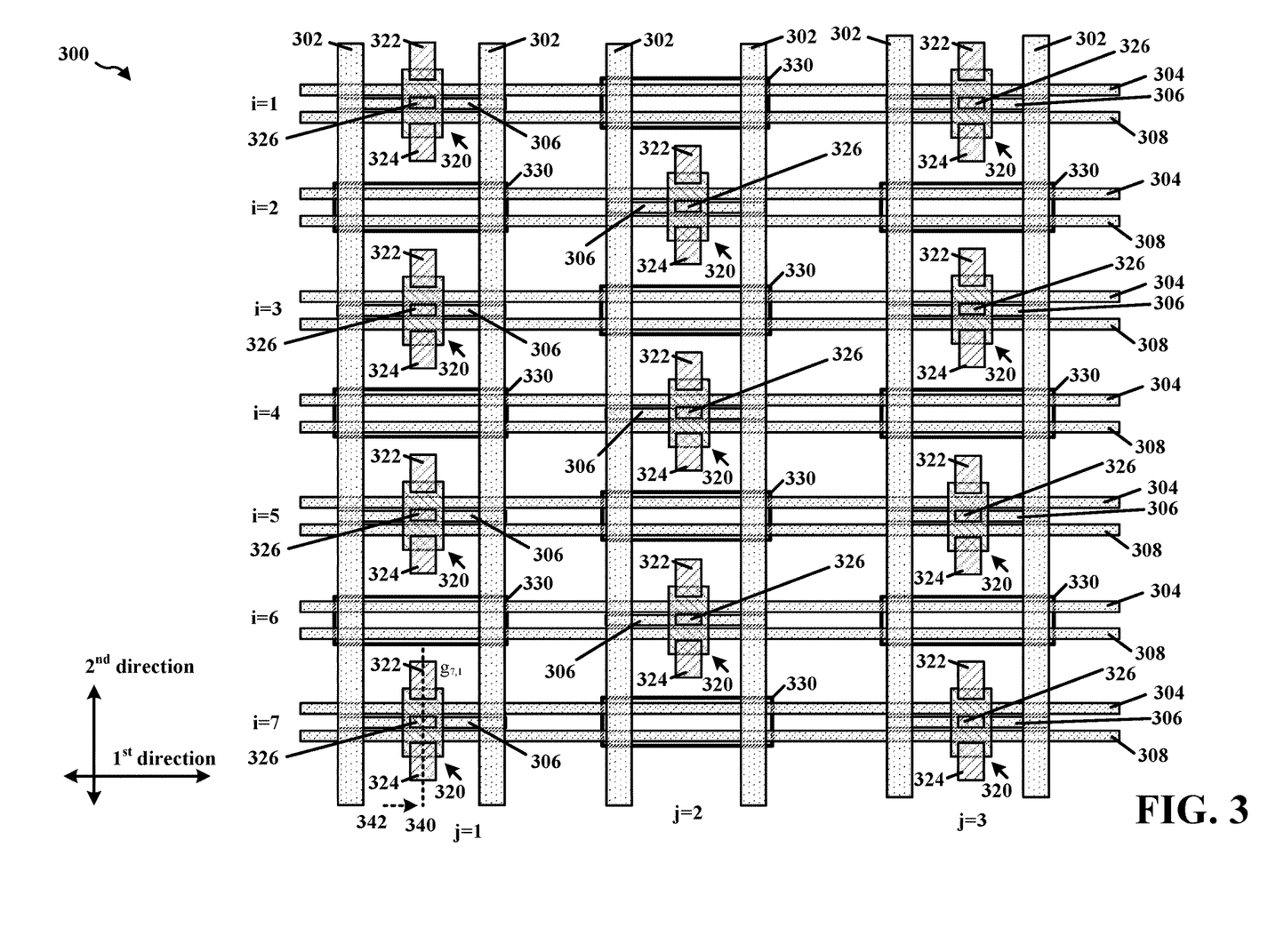
FIG. 3 is a first diagram conceptually illustrating a top view of a sensing network with a plurality of sensing elements.
Figure 4A:
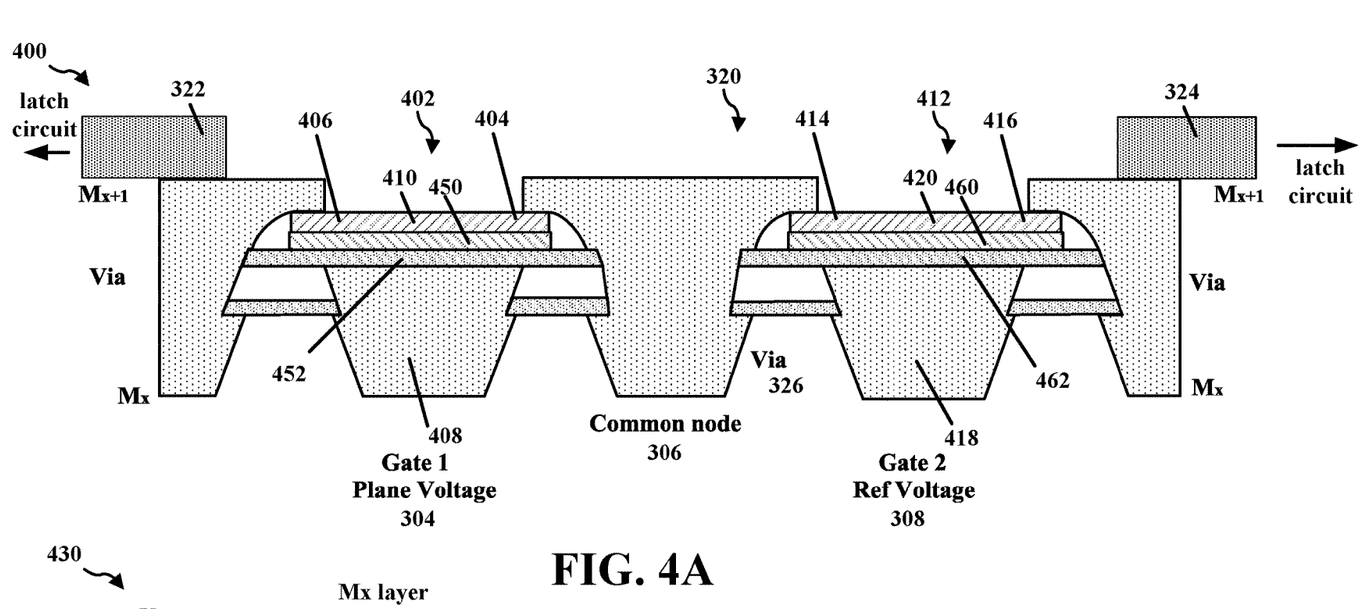
FIG. 4A is a diagram illustrating a side cut view of a sensing element.
Figure 4B:
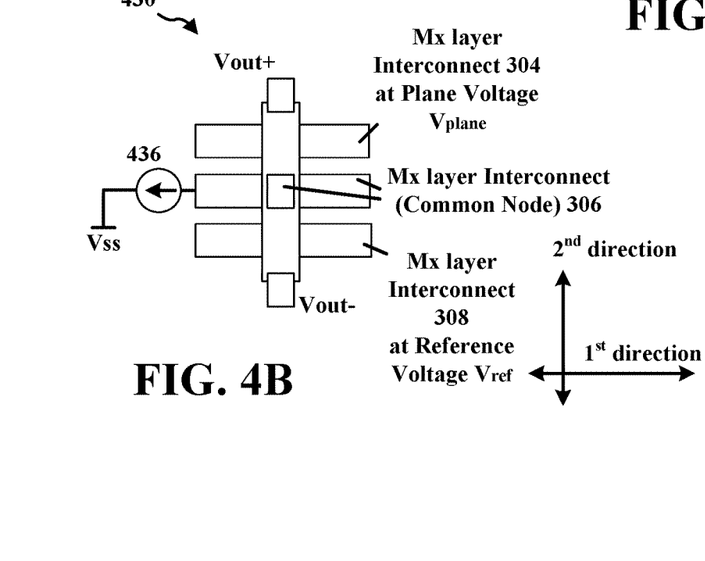
FIG. 4B is a diagram conceptually illustrating a current bias on the common node.
Figure 5:
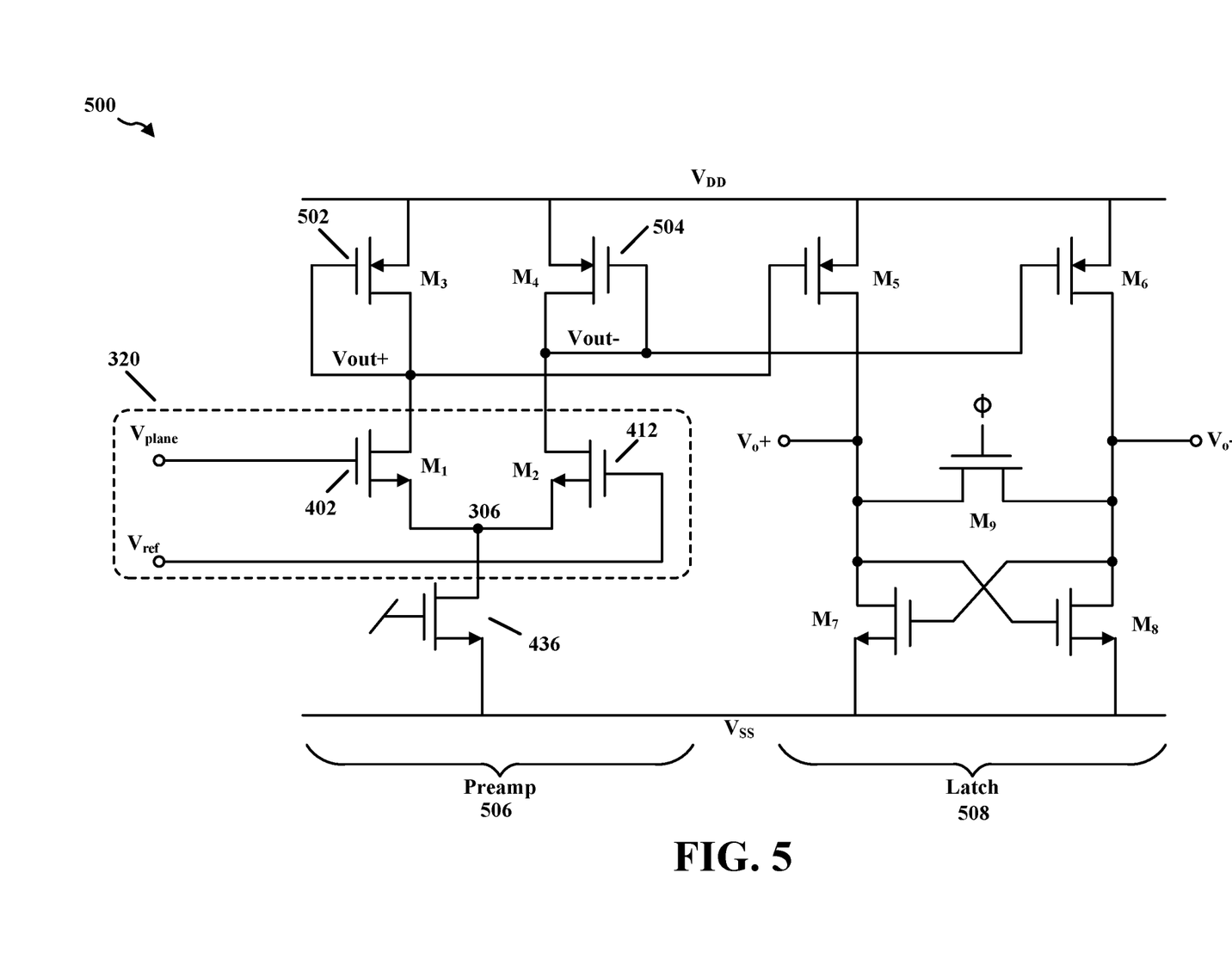
FIG. 5 is a circuit diagram illustrating a pre-amplifier circuit and a latch circuit.
Figure 6:
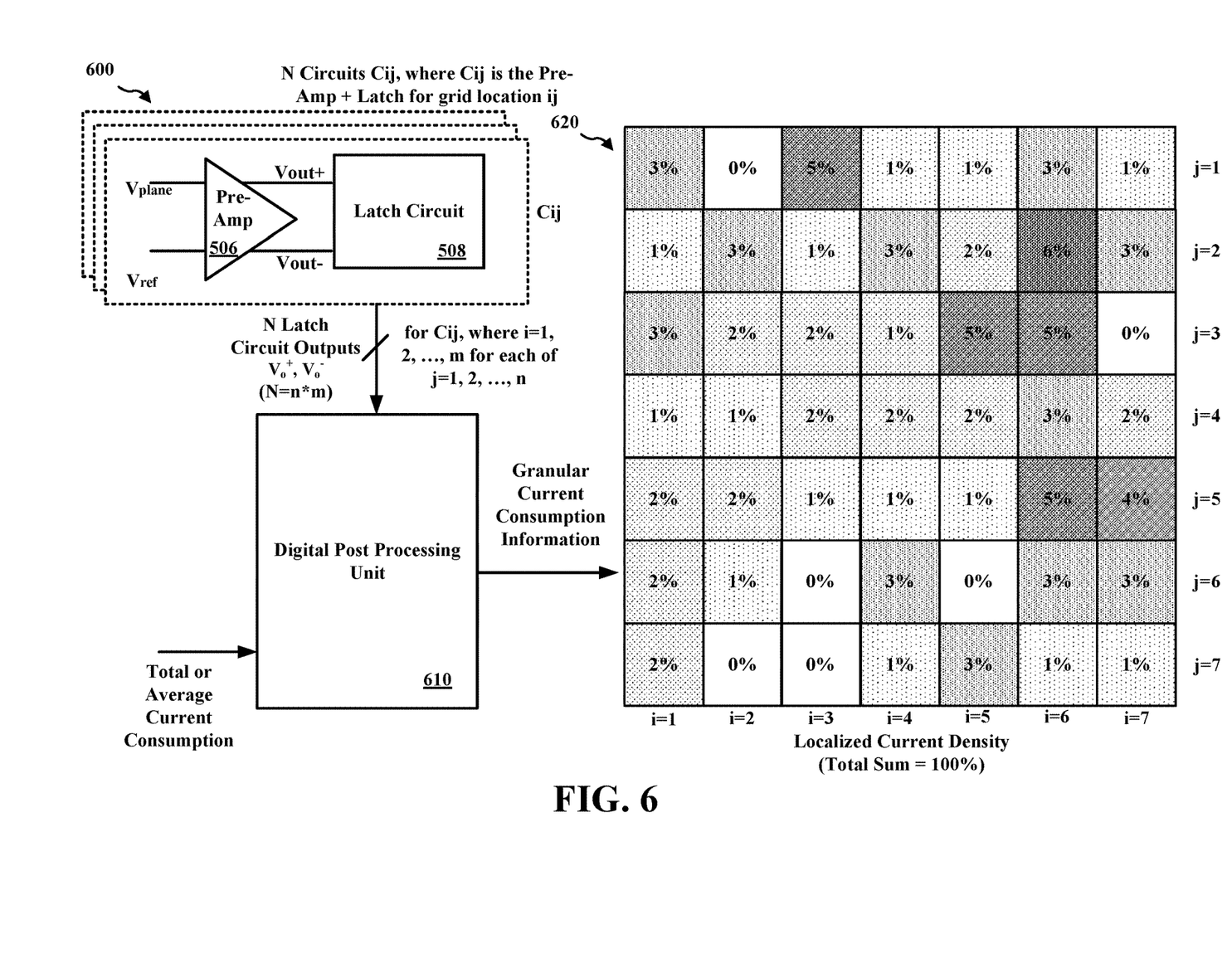
FIG. 6 is a first diagram conceptually illustrating granular sensing results through the provided sensing network.
Figure 7:
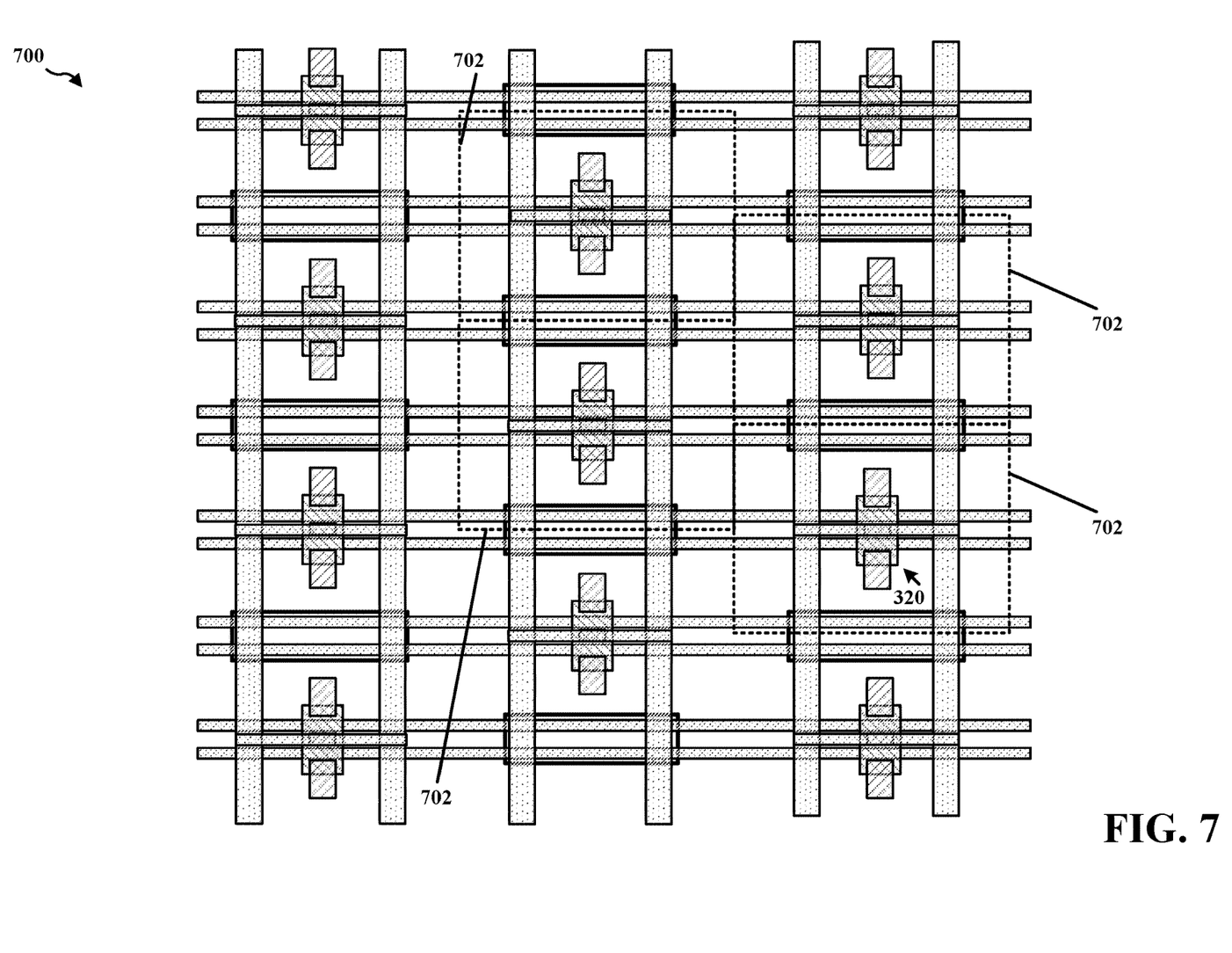
FIG. 7 is a second diagram conceptually illustrating a top view of a sensing network with a plurality of sensing elements and local sensing areas for each of the sensing elements.
Figure 8:
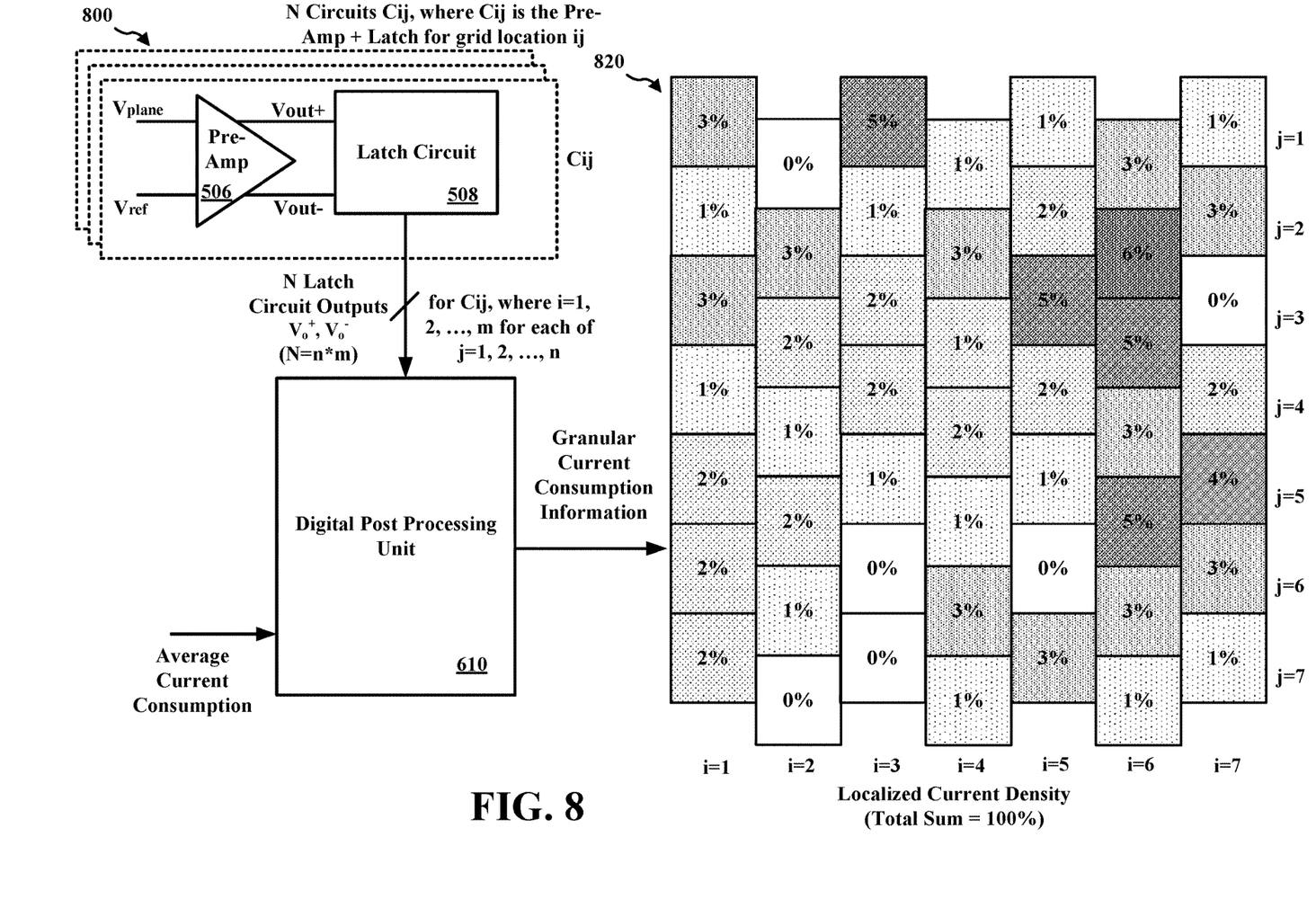
FIG. 8 is a second diagram conceptually illustrating granular sensing results through the provided sensing network.

With respect to performance, with greater granular sensing information, activity may be re-allocated in a zone where voltage drop is lower. Such activity re-allocation in order to reduce power consumption in higher voltage drop areas may improve the performance of the overall system. A sensing network is illustrated in FIGS. 3, 7. A sensing element within the sensing network is illustrated in FIGS. 4A, 4B, 4C. A circuit diagram including a sensing element is illustrated in FIG. 5. The granularity of the sensing information is illustrated in FIGS. 6, 8.

FIG. 3 is a diagram 300 conceptually illustrating a top view of a sensing network with a plurality of sensing elements 320. The sensing network includes a power grid including metal x ($M_x$) layer interconnects 304, 308 extending in a first direction on an $M_x$ layer and metal x+1 ($M_{x+1}$) layer interconnects 302 extending in a second direction orthogonal to the first direction on an $M_{x+1}$ layer, where x>5. The $M_x$ layer interconnect 306 may be a non-continuous metal segment contacting bias circuitry of each sensing element 320. Accordingly, the $M_x$ layer interconnects 304, 306, 308 and $M_{x+1}$ layer interconnects 302 are on metal layers 6, 7 or higher metal layers. In one example, the $M_x$ layer is two or three layers below a redistribution layer (RDL), where the RDL connects to a package for the IC. The $M_x$ layer may contain low impedance routing for all the power domains—an external supply from a power management integrated circuit (PMIC), a ground voltage Vss, and a power supply voltage Vdd provided through the power switches 330 and to devices at the substrate powered by the power switches 330. The power grid is part of the power delivery network (PDN) and delivers power to the devices below the PDN at the substrate. The $M_x$ layer may typically be two to three layers below the RDL. The PDN may have less noise at the $M_x$ layer, and accordingly, the PDN voltage drop may be more reliably sensed at the $M_x$ layer than at lower metal layers, such as closer to switchable transistor logic powered by the PDN. In one example, the $M_x$ layer may be located at a metal 11 layer. Accordingly, in such an example, the $M_x$ layer may be a metal 11 layer and the $M_{x+1}$ layer may be a metal 12 layer.

The $M_x$ layer interconnects 304, 308 may be coupled to a plane voltage and a reference voltage, respectively. The sensing network may further include a plurality of power switches 330 that may be tied together at the $M_x$ layer. The power switches 330 provide power to a set of switchable transistor logic located at the substrate of the IC. The power switches 330 may be located below the power grid at layers below the $M_x$ layer. In one example, the power switches 330 may be located at the substrate of the IC (see FIGS. 1, 2). The sensing network may further include sensing elements 320 located between the $M_x$ layer and the $M_{x+1}$ layer. The sensing elements 320 in a particular row i may be coupled to the $M_x$ layer interconnects 304, 308 extending in the first direction along the same row i. The $M_x$ layer interconnect 306 is a common node with a separate $M_x$ layer interconnect 306 connected to each of the sensing elements 320. Based on the plane voltage provided by the $M_x$ layer interconnect 304 and the reference voltage provided by the $M_x$ layer interconnect 308, each sensing element 320 may be configured to measure a voltage drop to devices (i.e., transistor logic, switchable logic) powered by the plurality of power switches 330 that are adjacent the sensing element 320. The common node 306 at each sensing element 320 includes a via 326. Measurements by the sensing elements 320 are output through the $M_{x+1}$ layer interconnects 322, 324.

As illustrated in FIG. 3, the power switches 330 are adjacent in the first direction and in the second direction to each sensing element 320. The power grid of the sensing network forms a grid with grid intersection locations $g_{ij}$, where i is a row of the grid and j is a column of the grid. The power switches 330 are illustrated located below grid intersection $g_{1,2}$, $g_{2,1}$, $g_{2,3}$, $g_{3,2}$, $g_{4,1}$, $g_{4,3}$, $g_{5,2}$, $g_{6,1}$, $g_{6,3}$, and $g_{7,2}$. More generally, the power switches 330 are located below grid intersection locations $g_{i,j}$ (between the $M_x$ and $M_{x+1}$ layers) for i=2n−1 and j=2m and below grid intersection locations $g_{i,j}$ for i=2n and j=2m−1 for integer n≥1 and integer m≥1. The sensing elements 320 are illustrated at grid intersection $g_{1,1}$, $g_{1,3}$, $g_{2,2}$, $g_{3,1}$, $g_{3,3}$, $g_{4,2}$, $g_{5,1}$, $g_{5,3}$, $g_{6,2}$, $g_{7,1}$, and $g_{7,3}$. More generally, the sensing elements 320 are located at grid intersection locations $g_{i,j}$ for i=2n−1 and j=2m−1 and at grid locations $g_{i,j}$ for i=2n and j=2m for integer n≥1 and integer m≥1. The same structure of power switches 330 and sensing elements 320 may be maintained with any shift x in the first direction and y in the second direction within the power grid, for any integers x and y, and therefore the above equations are valid for i→i+x and j→j+y.

The sensing element 320 is described with respect to FIG. 4A. FIG. 4A illustrates a side view of the sensing element 320 in the first direction (see arrow 342) at cut 340 of grid location $g_{7,j}$.

FIG. 4A is a diagram 400 illustrating a side cut view of a sensing element 320. FIG. 4B is a diagram 430 conceptually illustrating a current bias on the common node 306. Referring to FIG. 4A, the sensing element 320 includes two transistors 402, 412. In one example, the two transistors may be n-type or a p-type indium gallium zinc oxide (IGZO) transistors. In another example, the two transistors may be tungsten doped indium oxide (also referred to as indium tungsten oxide (IWO)) transistors. In yet another example, the two transistors may be any type of transistors that can be reliably manufactured between the $M_x$ and $M_{x+1}$ layers. The first transistor 402 includes a channel (active/diffusion region) 410 including a first transistor source 404, a first transistor drain 406, and first transistor gate 408. The first transistor gate 408 is formed from the $M_x$ layer interconnect 304. A gate dielectric 450 and an interlayer dielectric 452 are located between the channel 410 and the first transistor gate 408. The second transistor 412 includes a channel (active/diffusion region) 420, a second transistor source 414, a second transistor drain 416, and a second transistor gate 418. The second transistor gate 418 is formed from the $M_x$ layer interconnect 308. A gate dielectric 460 and an interlayer dielectric 462 are located between the channel 420 and the second transistor gate 418. The first transistor source 404 and the second transistor source 414 are coupled to a common node 306, which extends between the $M_x$ layer and the $M_{x+1}$ layer with a via 326. As illustrated in FIG. 4B, the common node 306 is configured to be biased by a current source 436. The first transistor gate 408 is configured to be coupled to a plane voltage $V_{plane}$ representative of a power supply voltage supplied to the plurality of power switches 330. The second transistor gate 418 is configured to be coupled to a programmable reference voltage. The first transistor drain 406 and the second transistor drain 416 are each coupled to $M_{x+1}$ layer interconnects 322, 324, respectively, and are configured to be coupled to a regenerative latch circuit for storing a value based on whether the plane voltage is greater than the programmable reference voltage or less than the programmable reference voltage.

The first transistor gate 308 is formed by a first $M_x$ layer interconnect 304 that extends in the first direction across the IC. The second transistor gate 418 is formed by a second $M_x$ layer interconnect 308 that extends in the first direction across the IC. The common node 306 is formed by a third $M_x$ layer interconnect 306 that extends in the first direction. The third $M_x$ layer interconnect 306 is between the first and second $M_x$ layer interconnects 304, 308. As illustrated in FIG. 3, the first and second $M_x$ layer interconnects 304, 308, respectively, are shared among sensing elements 320 in the first direction.

FIG. 5 is a circuit diagram 500 illustrating a pre-amplifier (pre-amp) circuit 506 and a latch circuit 508. As illustrated in FIG. 5, forming the pre-amp circuit 506, sources of the n-type transistors 402, 412 (one sensor element 320) are connected at a common node 306. The common node 306 is biased by a current source 436 that is also coupled to a ground voltage Vss. The drains of the transistors 402, 412 are coupled to resistive loads, which are illustrated as p-type transistors 502, 504 (but may be n-type transistors when the transistors of the sensor element 320 are p-type transistors) configured with their gates tied to their respective drains. The sources of the p-type transistors 502, 504 are coupled to a power supply voltage Vdd. The output of the sensor element 320 and the pre-amp circuit 506 Vout$^+$, Vout$^-$ feeds into a latch circuit 508. Outputs $V_o^+$, $V_o^-$ are read by a digital post processing unit, as discussed in relation to FIG. 6.

The circuit 500 compares the reference voltage $V_{ref}$ to the plane voltage $V_{plane}$, where the reference voltage $V_{ref}$ may be varied. Without any voltage drop, the plane voltage $V_{plane}$ would be at the power supply voltage Vdd. When the reference voltage $V_{ref}$ is greater than the plane voltage $V_{plane}$ (i.e., $V_{ref} > V_{plane}$), Vout$^+$>Vout$^-$, and when the reference voltage $V_{ref}$ is less than the plane voltage $V_{plane}$ (i.e., $V_{ref} < V_{plane}$), Vout$^+$<Vout$^-$. Accordingly, the reference voltage $V_{ref}$ may be stepped up or down and compared to the plane voltage $V_{plane}$ at each step through comparing the voltage values at Vout$^+$, Vout$^-$ to determine the value of the plane voltage $V_{plane}$. The plane voltage $V_{plane}$ may be compared to the power supply voltage Vdd to determine the voltage drop and corresponding current consumption in the local area of the sensing element 320.

FIG. 6 is a first diagram 600 conceptually illustrating granular sensing results through the provided sensing network. The sensing elements 320 are each within the corresponding pre-amp 506 for circuit Cij (500) (of N circuits Cij), where Cij for i=1, 2, . . . , m for each j=1, 2, . . . , n provides localized current density information at location ij of the grid 620 and N=n*m. In FIG. 6, the grid is 7×7, and therefore n=7 and m=7 and N=49. The output of the sensing elements 320 and the pre-amp 506 of circuit Cij feeds into a latch circuit 508 within circuit Cij for temporary storage. The output of each latch circuit 508 within the circuit Cij is provided on a bus for reading by a digital post processing unit 610. The digital post processing unit 610 further receives information (e.g., from a PMIC) indicating a total or an average current consumption by transistor devices powered by the power switches 330. Based on the sensing elements output and average current consumption information, the digital post processing unit 610 estimates localized current density information 620. Specifically, assuming the total load current for devices powered by the power switches 330 is $I_{load}$, and assuming the sensing elements 320 are in an n×m array, the average load current per sensing element 320 would be $I_{load}/n*m$. Based on the average load current $I_{load}/n*m$ and the sensing elements output, the digital post processing unit 610 is configured to estimate the localized current density information 620. The localized current density information 620 may be a local percentage of the total current that is consumed in the tile/area of the grid 620.

FIG. 7 is a second diagram 700 conceptually illustrating a top view of a sensing network with a plurality of sensing elements 320 and local sensing areas 702 for each of the sensing elements 320. As illustrated in FIG. 7, as the sensing elements 320 have a 50% offset in each column, the sensing areas 702 also have a 50% offset. The effect of the offset on the localized current density information is illustrated with respect to FIG. 8.

FIG. 8 is a second diagram 800 conceptually illustrating granular sensing results through the provided sensing network. As the sensing elements 320 have an offset in each column, the local areas for the localized current density information 820 may be offset from each other in each column as illustrated in FIG. 8. The localized current density information 820 may be a local percentage of the total current that is consumed in the tile/area of the grid 820.

Referring again to FIGS. 1-8, in one configuration, an IC includes a power grid including $M_x$ layer interconnects 304, 306, 308 extending in a first direction on an $M_x$ layer and $M_{x+1}$ layer interconnects 302 extending in a second direction orthogonal to the first direction on an $M_{x+1}$ layer, where x>5. The IC further includes a plurality of power switches 330. The IC further includes at least one sensing element 320 located between the $M_x$ layer and the $M_{x+1}$ layer and configured to measure a voltage drop to devices powered by the plurality of power switches 330.

In one configuration, the one or more of the plurality of power switches 330 is located below the power grid. In one configuration, the power switches 330 of the plurality of power switches are adjacent in the first direction and in the second direction to each sensing element 320 of the at least one sensing element 320. In one configuration, as illustrated in FIG. 3, the power grid forms a grid with grid intersection locations $g_{i,j}$, where i is a row of the grid and j is a column of the grid. In addition, the plurality of power switches is located below grid intersection locations $g_{i,j}$ for i=2n−1 and j=2m and below grid intersection locations $g_{i,j}$ for i=2n and j=2m−1 for integer n≥1 and integer m≥1. Further, the at least one sensing element is at grid locations $g_{i,j}$ for i=2n−1 and j=2m−1 and at grid locations $g_{i,j}$ for i=2n and j=2m for integer n≥1 and integer m≥1.

In one configuration, each of the sensing elements 320 includes a first transistor 402 including a first transistor source 404, a first transistor drain 406, and a first transistor gate 408; and a second transistor 412 including a second transistor source 414, a second transistor drain 416, and a second transistor gate 418. The first transistor source 404 is coupled to the second transistor source 414 at a common node 306 on the $M_x$ layer and $M_{x+1}$ layer. In one configuration, the common node 306 is configured to be coupled to a current source 436. In one configuration, the first transistor gate 408 is configured to be coupled to a plane voltage $V_{plane}$ representative of a power supply voltage Vdd supplied to the plurality of power switches 330, and the second transistor gate 418 is configured to be coupled to a programmable reference voltage $V_{ref}$. In one configuration, the first transistor drain 406 and the second transistor drain 416 are configured to be coupled to a latch circuit 508 for storing a value based on whether the plane voltage $V_{plane}$ is greater than the programmable reference voltage $V_{ref}$ or less than the programmable reference voltage $V_{ref}$. In one configuration, the first transistor 402 and the second transistor 412 are one of n-type or p-type IGZO transistors or IWO transistors. In one configuration, the first transistor gate 408 includes a first $M_x$ layer interconnect 304 extending in the first direction across the IC, the second transistor gate includes a second $M_x$ layer interconnect 308 extending in the first direction across the IC, and the common node includes a third $M_x$ layer interconnect 306 extending in the first direction. The third $M_x$ layer interconnect 306 is between the first and second $M_x$ layer interconnects 304, 308. The first and second $M_x$ layer interconnects 304, 308, respectively, are shared among sensing elements 320 in the first direction. In one configuration, the common node 306 further includes at least one via 326 at the $M_{x+1}$ layer coupled to the third $M_x$ layer interconnect 306. In one configuration, the first transistor drain 406 is coupled to a first $M_{x+1}$ layer interconnect 322 and the second transistor drain 416 is coupled to a second $M_{x+1}$ layer interconnect 324. In one configuration, the first transistor 402 further includes a first dielectric 450 located above the first transistor gate 408 and a first channel 410 located above the first dielectric 450. A first portion of the first channel 410 forms the first transistor drain 406 adjacent the first $M_{x+1}$ layer interconnect 322 and a second portion of the first channel 410 forms the first transistor source 404 adjacent the common node 306 at the $M_{x+1}$ layer above the third $M_x$ layer interconnect 306. Further, in such a configuration, the second transistor 412 further includes a second dielectric 460 located above the second transistor gate 418 and a second channel 420 located above the second dielectric 460. A first portion of the second channel 420 forms the second transistor drain 416 adjacent the second $M_{x+1}$ layer interconnect 324 and a second portion of the second channel 420 forms the second transistor source 414 adjacent the common node 306 at the $M_{x+1}$ layer above the third $M_x$ layer interconnect 306. In one configuration, the $M_x$ layer is two or three layers below an RDL.

Referring to FIG. 4A, in one configuration, a sensing element 320 on an IC includes a first transistor 402 including a first transistor source 404, a first transistor drain 406, and a first transistor gate 408. The first transistor gate 408 is formed by a first $M_x$ layer interconnect 304 extending in a first direction, where x>5. The sensing element 320 on the IC further includes a second transistor 412 including a second transistor source 414, a second transistor drain 416, and a second transistor gate 418. The second transistor gate 418 is formed by a second $M_x$ layer interconnect 308 extending in the first direction. The first transistor source 404 is coupled to the second transistor source 414 at a common node 306 on the $M_x$ layer and an $M_{x+1}$ layer.

In one configuration, the common node 306 is configured to be coupled to a current source 436. In one configuration, the first transistor gate 408 is configured to be coupled to a plane voltage $V_{plane}$ representative of a power supply voltage Vdd supplied to a plurality of power switches 330, and the second transistor gate 418 is configured to be coupled to a programmable reference voltage $V_{ref}$. In one configuration, the first transistor drain 406 and the second transistor drain 416 are configured to be coupled to a latch circuit 508 for storing a value based on whether the plane voltage $V_{plane}$ is greater than the programmable reference voltage $V_{ref}$ or less than the programmable reference voltage $V_{ref}$. In one configuration, the first transistor 402 and the second transistor 412 are one of n-type or p-type IGZO transistors or IWO transistors. In one configuration, the common node 306 is formed by a third $M_x$ layer interconnect 306 extending in the first direction. The third $M_x$ layer interconnect 306 is between the first $M_x$ layer interconnect 304 and the second $M_x$ layer interconnect 308. In one configuration, the common node 306 further includes at least one via 326 at the $M_{x+1}$ layer coupled to the third $M_x$ layer interconnect 306. In one configuration, the first transistor 402 further includes a first dielectric 450 located above the first transistor gate 408 and a first channel 410 located above the first dielectric 450. A first portion of the first channel 410 forms the first transistor drain 406 and a second portion of the first channel 410 forms the first transistor source 404 adjacent the common node 306 at the $M_{x+1}$ layer above the third $M_x$ layer interconnect 306. In such a configuration, the second transistor 412 further includes a second dielectric 460 located above the second transistor gate 418 and a second channel 420 located above the second dielectric 460. A first portion of the second channel 420 forms the second transistor drain 416 and a second portion of the second channel 420 forms the second transistor source 414 adjacent the common node 306 at the $M_{x+1}$ layer above the third $M_x$ layer interconnect 306. In one configuration, the first transistor 402 further includes a first interlayer dielectric 452 between the first dielectric 450 and the first transistor gate 408, and the second transistor 412 further includes a second interlayer dielectric 462 between the second dielectric 460 and the second transistor gate 418. In one configuration, the $M_x$ layer is two or three layers below an RDL.

As discussed supra, a sensing network including sensing elements 320 may be formed on a metal layer a few layers below the RDL (see FIG. 3) where the PDN voltage drop may be more reliably sensed. As illustrated in FIG. 3, the sensing elements 320 may be located between four adjacent power switches 330 so that the sensing elements 320 can provide granular information (see FIGS. 6, 8) in association with devices powered by the four adjacent power switches 330.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Example 1 is an IC including a power grid including $M_x$ layer interconnects extending in a first direction on an $M_x$ layer and $M_{x+1}$ layer interconnects extending in a second direction orthogonal to the first direction on an $M_{x+1}$ layer, where x>5. The IC further includes a plurality of power switches. The IC further includes at least one sensing element located between the $M_x$ layer and the $M_{x+1}$ layer and configured to measure a voltage drop to devices powered by the plurality of power switches.

Example 2 is the IC of the example 1, wherein one or more of the plurality of power switches is located below the power grid.

Example 3 is the IC of any of examples 1 and 2, wherein the power switches of the plurality of power switches are adjacent in the first direction and in the second direction to each sensing element of the at least one sensing element.

Example 4 is the IC of any of examples 1 to 3, wherein the power grid forms a grid with grid intersection locations $g_{i,j}$, where i is a row of the grid and j is a column of the grid; the plurality of power switches is located below grid intersection locations $g_{i,j}$ for i=2n−1 and j=2m and below grid intersection locations $g_{i,j}$ for i=2n and j=2m−1 for integer n≥1 and integer m≥1; and the at least one sensing element is at grid locations $g_{i,j}$ for i=2n−1 and j=2m−1 and at grid locations $g_{i,j}$ for i=2n and j=2m for integer n≥1 and integer m≥1.

Example 5 is the IC of any of examples 1 to 4, wherein each of the sensing elements includes a first transistor including a first transistor source, a first transistor drain, and a first transistor gate; and a second transistor including a second transistor source, a second transistor drain, and a second transistor gate, the first transistor source being coupled to the second transistor source at a common node on the $M_x$ layer and $M_{x+1}$ layer.

Example 6 is the IC of example 5, wherein the common node is configured to be coupled to a current source.

Example 7 is the IC of any of examples 5 and 6, wherein the first transistor gate is configured to be coupled to a plane voltage representative of a power supply voltage supplied to the plurality of power switches, and the second transistor gate is configured to be coupled to a programmable reference voltage.

Example 8 is the IC of any of example 5 to 7, wherein the first transistor drain and the second transistor drain are configured to be coupled to a latch circuit for storing a value based on whether the plane voltage is greater than the programmable reference voltage or less than the programmable reference voltage.

Example 9 is the IC of any of examples 5 to 8, wherein the first transistor and the second transistor are one of n-type or p-type IGZO transistors or IWO transistors.

Example 10 is the IC of any of examples 5 to 9, wherein the first transistor gate includes a first $M_x$ layer interconnect extending in the first direction across the IC, the second transistor gate includes a second $M_x$ layer interconnect extending in the first direction across the IC, and the common node includes a third $M_x$ layer interconnect extending in the first direction. The third $M_x$ layer interconnect is between the first and second $M_x$ layer interconnects. The first and second $M_x$ layer interconnects are shared among sensing elements in the first direction.

Example 11 is the IC of example 10, wherein the common node further includes at least one via at the $M_{x+1}$ layer coupled to the third $M_x$ layer interconnect.

Example 12 is the IC of any of examples 10 and 11, wherein the first transistor drain is coupled to a first $M_{x+1}$ layer interconnect and the second transistor drain is coupled to a second $M_{x+1}$ layer interconnect.

Example 13 is the IC of example 12, wherein the first transistor further includes a first dielectric located above the first transistor gate and a first channel located above the first dielectric. A first portion of the first channel forms the first transistor drain adjacent the first $M_{x+1}$ layer interconnect and a second portion of the first channel forms the first transistor source adjacent the common node at the $M_{x+1}$ layer above the third $M_x$ layer interconnect. The second transistor further includes a second dielectric located above the second transistor gate and a second channel located above the second dielectric. A first portion of the second channel forms the second transistor drain adjacent the second $M_{x+1}$ layer interconnect and a second portion of the second channel forms the second transistor source adjacent the common node at the $M_{x+1}$ layer above the third $M_x$ layer interconnect.

Example 14 is the IC of any of examples 1 to 13, wherein the $M_x$ layer is two or three layers below an RDL.

Example 15 is a sensing element on an IC. The sensing element includes a first transistor including a first transistor source, a first transistor drain, and a first transistor gate. The first transistor gate is formed by a first $M_x$ layer interconnect extending in a first direction, where x>5. The sensing element includes a second transistor including a second transistor source, a second transistor drain, and a second transistor gate. The second transistor gate is formed by a second $M_x$ layer interconnect extending in the first direction. The first transistor source is coupled to the second transistor source at a common node on the $M_x$ layer and an $M_{x+1}$ layer.

Example 16 is the sensing element of example 15, wherein the common node is configured to be coupled to a current source.

Example 17 is the sensing element of any of examples 15 and 16, wherein the first transistor gate is configured to be coupled to a plane voltage representative of a power supply voltage supplied to a plurality of power switches, and the second transistor gate is configured to be coupled to a programmable reference voltage.

Example 18 is the sensing element of example 17, wherein the first transistor drain and the second transistor drain are configured to be coupled to a latch circuit for storing a value based on whether the plane voltage is greater than the programmable reference voltage or less than the programmable reference voltage.

Example 19 is the sensing element of any of examples 15 to 18, wherein the first transistor and the second transistor are one of n-type or p-type IGZO transistors or IWO transistors.

Example 20 is the sensing element of any of examples 15 to 19, wherein the common node is formed by a third $M_x$ layer interconnect extending in the first direction. The third $M_x$ layer interconnect is between the first $M_x$ layer interconnect and the second $M_x$ layer interconnect.

Example 21 is the sensing element of example 20, wherein the common node further includes at least one via at the $M_{x+1}$ layer coupled to the third $M_x$ layer interconnect.

Example 22 is the sensing element of any of example 20 and 21, wherein the first transistor further includes a first dielectric located above the first transistor gate and a first channel located above the first dielectric. A first portion of the first channel forms the first transistor drain and a second portion of the first channel forms the first transistor source adjacent the common node at the $M_{x+1}$ layer above the third $M_x$ layer interconnect. The second transistor further includes a second dielectric located above the second transistor gate and a second channel located above the second dielectric. A first portion of the second channel forms the second transistor drain and a second portion of the second channel forms the second transistor source adjacent the common node at the $M_{x+1}$ layer above the third $M_x$ layer interconnect.

Example 23 is the sensing element of example 22, wherein the first transistor further includes a first interlayer dielectric between the first dielectric and the first transistor gate, and the second transistor further includes a second interlayer dielectric between the second dielectric and the second transistor gate.

Example 24 is the sensing element of any of examples 15 to 23, wherein the $M_x$ layer is two or three layers below an RDL.

What is claimed is:

1. An integrated circuit (IC), comprising:
   a power grid including metal x ($M_x$) layer interconnects extending in a first direction on an $M_x$ layer and metal x+1 ($M_{x+1}$) layer interconnects extending in a second direction orthogonal to the first direction on an $M_{x+1}$ layer, where x>5;
   a plurality of power switches; and
   at least one sensing element located between the $M_x$ layer and the $M_{x+1}$ layer and configured to measure a voltage drop to devices powered by the plurality of power switches.

2. The IC of claim 1, wherein one or more of the plurality of power switches is located below the power grid.

3. The IC of claim 1, wherein the power switches of the plurality of power switches are adjacent in the first direction and in the second direction to each sensing element of the at least one sensing element.

4. The IC of claim 1, wherein:
   the power grid forms a grid with grid intersection locations $g_{i,j}$, where i is a row of the grid and j is a column of the grid;
   the plurality of power switches is located below grid intersection locations $g_{i,j}$ for i=2n−1 and j=2m and below grid intersection locations $g_{i,j}$ for i=2n and j=2m−1 for integer n≥1 and integer m≥1; and
   the at least one sensing element is at grid locations $g_{i,j}$ for i=2n−1 and j=2m−1 and at grid locations $g_{i,j}$ for i=2n and j=2m for integer n≥1 and integer m≥1.

5. The IC of claim 1, wherein each of the sensing elements comprises:
   a first transistor including a first transistor source, a first transistor drain, and a first transistor gate; and
   a second transistor including a second transistor source, a second transistor drain, and a second transistor gate, the first transistor source being coupled to the second transistor source at a common node on the $M_x$ layer and $M_{x+1}$ layer.

6. The IC of claim 5, wherein the common node is configured to be coupled to a current source.

7. The IC of claim 5, wherein the first transistor gate is configured to be coupled to a plane voltage representative of a power supply voltage supplied to the plurality of power switches, and the second transistor gate is configured to be coupled to a programmable reference voltage.

8. The IC of claim 7, wherein the first transistor drain and the second transistor drain are configured to be coupled to a latch circuit for storing a value based on whether the plane voltage is greater than the programmable reference voltage or less than the programmable reference voltage.

9. The IC of claim 5, wherein the first transistor and the second transistor are one of n-type or p-type indium gallium zinc oxide (IGZO) transistors or indium tungsten oxide (IWO) transistors.

10. The IC of claim 5, wherein the first transistor gate comprises a first $M_x$ layer interconnect extending in the first direction across the IC, the second transistor gate comprises a second $M_x$ layer interconnect extending in the first direction across the IC, and the common node comprises a third $M_x$ layer interconnect extending in the first direction, the third $M_x$ layer interconnect being between the first and second $M_x$ layer interconnects, and wherein the first and second $M_x$ layer interconnects are shared among sensing elements in the first direction.

11. The IC of claim 10, wherein the common node further comprises at least one via at the $M_{x+1}$ layer coupled to the third $M_x$ layer interconnect.

12. The IC of claim 10, wherein the first transistor drain is coupled to a first $M_{x+1}$ layer interconnect and the second transistor drain is coupled to a second $M_{x+1}$ layer interconnect.

13. The IC of claim 12, wherein:
the first transistor further comprises a first dielectric located above the first transistor gate and a first channel located above the first dielectric, a first portion of the first channel forming the first transistor drain adjacent the first $M_{x+1}$ layer interconnect and a second portion of the first channel forming the first transistor source adjacent the common node at the $M_{x+1}$ layer above the third $M_x$ layer interconnect; and
the second transistor further comprises a second dielectric located above the second transistor gate and a second channel located above the second dielectric, a first portion of the second channel forming the second transistor drain adjacent the second $M_{x+1}$ layer interconnect and a second portion of the second channel forming the second transistor source adjacent the common node at the $M_{x+1}$ layer above the third $M_x$ layer interconnect.

14. The IC of claim 1, wherein the $M_x$ layer is two or three layers below a redistribution layer (RDL).

15. A sensing element on an integrated circuit (IC), comprising:
a first transistor including a first transistor source, a first transistor drain, and a first transistor gate, the first transistor gate being formed by a first metal x ($M_x$) layer interconnect extending in a first direction, where x>5; and
a second transistor including a second transistor source, a second transistor drain, and a second transistor gate, the second transistor gate being formed by a second $M_x$ layer interconnect extending in the first direction, the first transistor source being coupled to the second transistor source at a common node on the $M_x$ layer and a metal x+1 ($M_{x+1}$) layer.

16. The sensing element of claim 15, wherein the common node is configured to be coupled to a current source.

17. The sensing element of claim 15, wherein the first transistor gate is configured to be coupled to a plane voltage representative of a power supply voltage supplied to a plurality of power switches, and the second transistor gate is configured to be coupled to a programmable reference voltage.

18. The sensing element of claim 17, wherein the first transistor drain and the second transistor drain are configured to be coupled to a latch circuit for storing a value based on whether the plane voltage is greater than the programmable reference voltage or less than the programmable reference voltage.

19. The sensing element of claim 15, wherein the first transistor and the second transistor are one of n-type or p-type indium gallium zinc oxide (IGZO) transistors or indium tungsten oxide (IWO) transistors.

20. The sensing element of claim 15, wherein the common node is formed by a third $M_x$ layer interconnect extending in the first direction, the third $M_x$ layer interconnect being between the first $M_x$ layer interconnect and the second $M_x$ layer interconnect.

21. The sensing element of claim 20, wherein the common node further comprises at least one via at the $M_{x+1}$ layer coupled to the third $M_x$ layer interconnect.

22. The sensing element of claim 20, wherein:
the first transistor further comprises a first dielectric located above the first transistor gate and a first channel located above the first dielectric, a first portion of the first channel forming the first transistor drain and a second portion of the first channel forming the first transistor source adjacent the common node at the $M_{x+1}$ layer above the third $M_x$ layer interconnect; and
the second transistor further comprises a second dielectric located above the second transistor gate and a second channel located above the second dielectric, a first portion of the second channel forming the second transistor drain and a second portion of the second channel forming the second transistor source adjacent the common node at the $M_{x+1}$ layer above the third $M_x$ layer interconnect.

23. The sensing element of claim 22, wherein the first transistor further comprises a first interlayer dielectric between the first dielectric and the first transistor gate, and the second transistor further comprises a second interlayer dielectric between the second dielectric and the second transistor gate.

24. The sensing element of claim 15, wherein the $M_x$ layer is two or three layers below a redistribution layer (RDL).

* * * * *